United States Patent
Weber et al.

(10) Patent No.: US 9,568,491 B2
(45) Date of Patent: Feb. 14, 2017

(54) REDUCING THE EFFECT OF GLASS CHARGING IN MEMS DEVICES

(71) Applicant: Honeywell International Inc., Morristown, NJ (US)

(72) Inventors: Mark W. Weber, Zimmerman, MN (US); Timothy J. Hanson, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 315 days.

(21) Appl. No.: 13/936,938

(22) Filed: Jul. 8, 2013

(65) Prior Publication Data
US 2015/0007656 A1    Jan. 8, 2015

(51) Int. Cl.
*G01P 15/08*    (2006.01)
*B81C 1/00*    (2006.01)

(52) U.S. Cl.
CPC ........... *G01P 15/08* (2013.01); *B81C 1/00698* (2013.01); *G01P 2015/0862* (2013.01); *G01P 2015/0871* (2013.01); *G01P 2015/0874* (2013.01)

(58) Field of Classification Search
CPC .............. G01P 15/08; G01P 2015/0862; G01P 2015/0874; G01P 2015/0871; B81C 1/00698
USPC ............................ 73/514.16, 514.32, 514.36
See application file for complete search history.

(56) References Cited

U.S. PATENT DOCUMENTS

| | | | | |
|---|---|---|---|---|
| 5,481,914 A | * | 1/1996 | Ward | H03F 1/083 73/504.16 |
| 5,587,518 A | * | 12/1996 | Stevenson | G01P 21/00 73/1.38 |
| 5,640,039 A | * | 6/1997 | Chau | G01P 15/0802 257/417 |
| 5,646,348 A | * | 7/1997 | Greiff | G01P 15/0802 324/688 |
| 5,892,153 A | * | 4/1999 | Weinberg et al. | 73/504.16 |

(Continued)

FOREIGN PATENT DOCUMENTS

EP    2093876    8/2009

OTHER PUBLICATIONS

Langfelder et al, MEMS Motion Sensors Based on the Variations of the Fringe Capacitances, Apr. 2011, IEEE Sensors Journal, vol. 11, No. 4.*

(Continued)

*Primary Examiner* — Michael A Lyons
*Assistant Examiner* — David L Singer
(74) *Attorney, Agent, or Firm* — Fogg and Powers LLC

(57) ABSTRACT

A method of controlling exposed glass charging in a micro-electro-mechanical systems (MEMS) device is disclosed. The method includes providing a MEMS device comprising a proof mass positioned apart from at least one sense plate and at least one outboard metallization layer, wherein at least one conductive glass layer is coupled to the sense plate and the outboard metallization layer, the conductive glass layer including at least one exposed glass portion near the proof mass; and applying a first voltage to the sense plate and a second voltage to the outboard metallization layer. The first voltage is separated from the second voltage by a predetermined voltage level such that the exposed glass portion has an average voltage corresponding to a voltage midway between the first voltage and the second voltage.

15 Claims, 7 Drawing Sheets

(56) References Cited

U.S. PATENT DOCUMENTS

| | | | |
|---|---|---|---|
| 5,952,574 A * | 9/1999 | Weinberg | G01C 19/5719 438/50 |
| 6,718,825 B1 * | 4/2004 | Platt | B81B 3/0008 73/1.82 |
| 7,028,548 B2 * | 4/2006 | Higuchi | G01C 19/5719 73/504.16 |
| 7,204,737 B2 | 4/2007 | Ding et al. | |
| 7,911,672 B2 | 3/2011 | Zhou | |
| 2002/0139647 A1 | 10/2002 | Bernstein | |
| 2003/0066351 A1 * | 4/2003 | Weinberg | G01C 19/5719 73/504.16 |
| 2004/0239341 A1 * | 12/2004 | Aoyagi et al. | 324/661 |
| 2005/0284222 A1 * | 12/2005 | Johnson | G01C 19/5719 73/504.02 |
| 2006/0213265 A1 * | 9/2006 | Weber | G01C 19/5719 73/504.02 |
| 2007/0062285 A1 | 3/2007 | Yamaguchi et al. | |
| 2010/0000324 A1 * | 1/2010 | Yoshikawa et al. | 73/514.32 |
| 2012/0125747 A1 * | 5/2012 | Chu et al. | 200/181 |
| 2012/0319527 A1 * | 12/2012 | Jahnes et al. | 310/300 |

OTHER PUBLICATIONS

European Patent Office, "European Search Report for Application No. 14173549.8", for Foreign Counterpart U.S. Appl. No. 13/936,938, Nov. 5, 2014, pp. 1-6, Published in: EP.
European Patent Office, European Office Action for Application Serial No. 14173549.8, from Foreign Counterpart to U.S. Appl. No. 13/936,938, filed Feb. 18, 2015, pp. 1-4, Published in: EP.

* cited by examiner

REDUCING THE EFFECT OF GLASS CHARGING IN MEMS DEVICES

BACKGROUND

Micro-Electro-Mechanical Systems (MEMS) devices can include various sensors, such as gyroscopes and accelerometers, which can be implemented in various inertial navigation and control system applications. A MEMS gyroscope or accelerometer may include microstructure sense elements such as a proof pass interposed between a pair of sense plates, forming a capacitive sensor.

Glass layers are often utilized as structures in MEMS devices. These glass layers are typically doped, which results in the glass having some conductivity, allowing electrical charges to flow and accumulate on the glass during operation of the MEMS devices. Sometimes it is convenient or necessary to allow uncovered glass to be exposed to the proof mass of a MEMS device such as in a capacitive MEMS sensor. As a result, the effective sensitivity of the device changes as charge is accumulated on the glass during operation. This makes the scale factor, bias, or other performance metrics of the MEMS sensor unreliable.

SUMMARY

A method of controlling exposed glass charging in a micro-electro-mechanical systems (MEMS) device includes providing a MEMS device comprising a proof mass positioned apart from at least one sense plate and at least one outboard metallization layer, wherein at least one conductive glass layer is coupled to the sense plate and the outboard metallization layer, the conductive glass layer including at least one exposed glass portion near the proof mass; and applying a first voltage to the sense plate and a second voltage to the outboard metallization layer. The first voltage is separated from the second voltage by a predetermined voltage level such that the exposed glass portion has an average voltage corresponding to a voltage midway between the first voltage and the second voltage.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

Figure 1A:
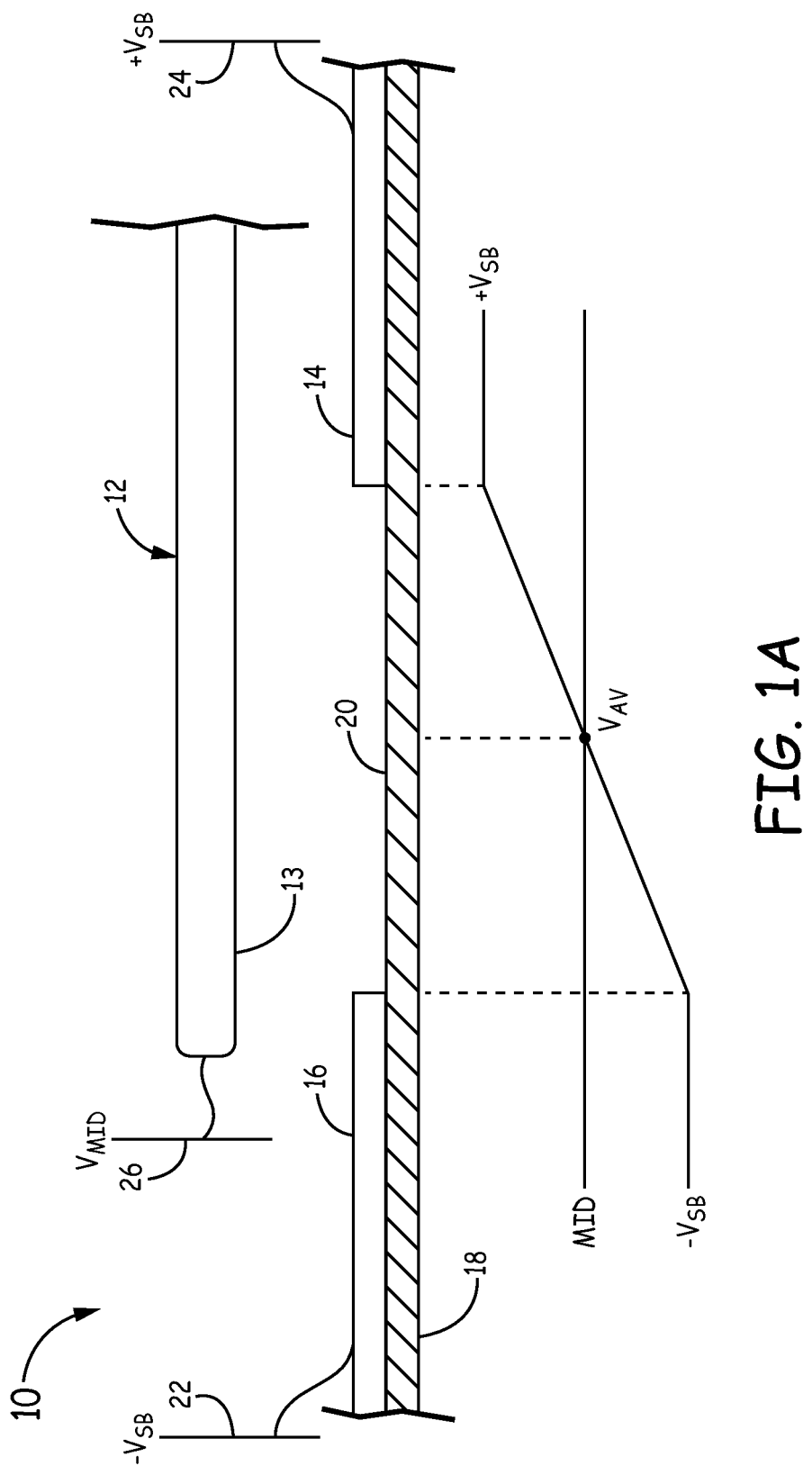
FIG. 1A is a schematic depiction of a MEMS device and voltage diagram, which illustrate the present technique according to one embodiment.

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A method of controlling glass charging in a Micro-Electro-Mechanical Systems (MEMS MEMS device is provided. The present approach allows for controlling the electrical charge of conductive exposed glass in a MEMS device resulting in the glass charging having no effect on sensor performance. The present technique does not stop the exposed glass from charging, but allows it to proceed in a balanced way so that it has no net effect on the sensor bias or scale factor over time. In this way, the performance of the MEMS device over time is unaffected by the time-varying potential of the exposed glass.

In general, the present method controls exposed glass potential levels so as to render them unimportant and not affecting sensor performance. For example, a first voltage is applied to the sense plate and a second voltage is applied to the outboard metallization layer, with the first voltage separated from the second voltage by a predetermined voltage level such that exposed glass has an average voltage corresponding to a voltage midway between the first voltage level and the second voltage level. This makes the average potential across the gap where the glass is exposed equal to MID (e.g., equal to the proof mass potential). With this average glass-charged voltage equal to that of the proof mass, it contributes no negative influence (degradation) on sensor performance.

In one embodiment, a sensor layout for the MEMS device is provided that eliminates the affect of glass charging without using an overlapping metal process.

The present approach is described in further detail hereafter with respect to the drawings. It should be noted that the exposed glass depicted in the drawings is not drawn to scale since the exposed glass is a very small fraction of the overall sense plate area. Most of the glass is "metalized" and only a small fraction of the glass is not covered, typically at a boundary that separates areas of different voltage potential in the MEMS device.

FIG. 1A is a schematic depiction of a MEMS device 10 according to one embodiment, which includes a voltage diagram illustrating one aspect of the present technique. The MEMS device 10 includes a proof mass 12 positioned over a sense plate 14 and an outboard metallization layer 16. A glass layer 18 is coupled to sense plate 14 and outboard metallization layer 16. The glass layer 18 is doped with conductive molecules (e.g., Na ions), which results in slightly conductive glass that aids in adhesion of sense plate 14 and outboard metallization layer 16 to glass layer 18. An exposed glass portion 20 of glass layer 18 that is near proof mass 12 faces an edge portion 13 of proof mass 12. When power is applied to MEMS device 10, the exposed glass portion 20 slowly collects a charge and has a potential that changes over time. In contrast, the portions of glass layer 18 covered with metal achieve voltage potential immediately, because the metal conducts very well.

As shown in FIG. 1A, outboard metallization layer 16 is connected to a $-V_{SB}$ (voltage standby) line 22, and sense plate 14 is connected to a $+V_{SB}$ line 24. The proof mass 12 is connected to $V_{mid}$ line 26 (voltage MID). This configuration results in the exposed glass portion 20 having an average voltage ($V_{AV}$) equal to MID (e.g., zero ground), as illustrated in the voltage diagram. With both proof mass 12 and exposed glass portion 20 at the same potential, the effect of time-varying glass charging on the sensor capacitance is eliminated. Thus, the effects of glass charging on proof mass 12 are removed by controlling the voltages applied to sense plate 14 and outboard metallization layer 16.

Figure 1B:
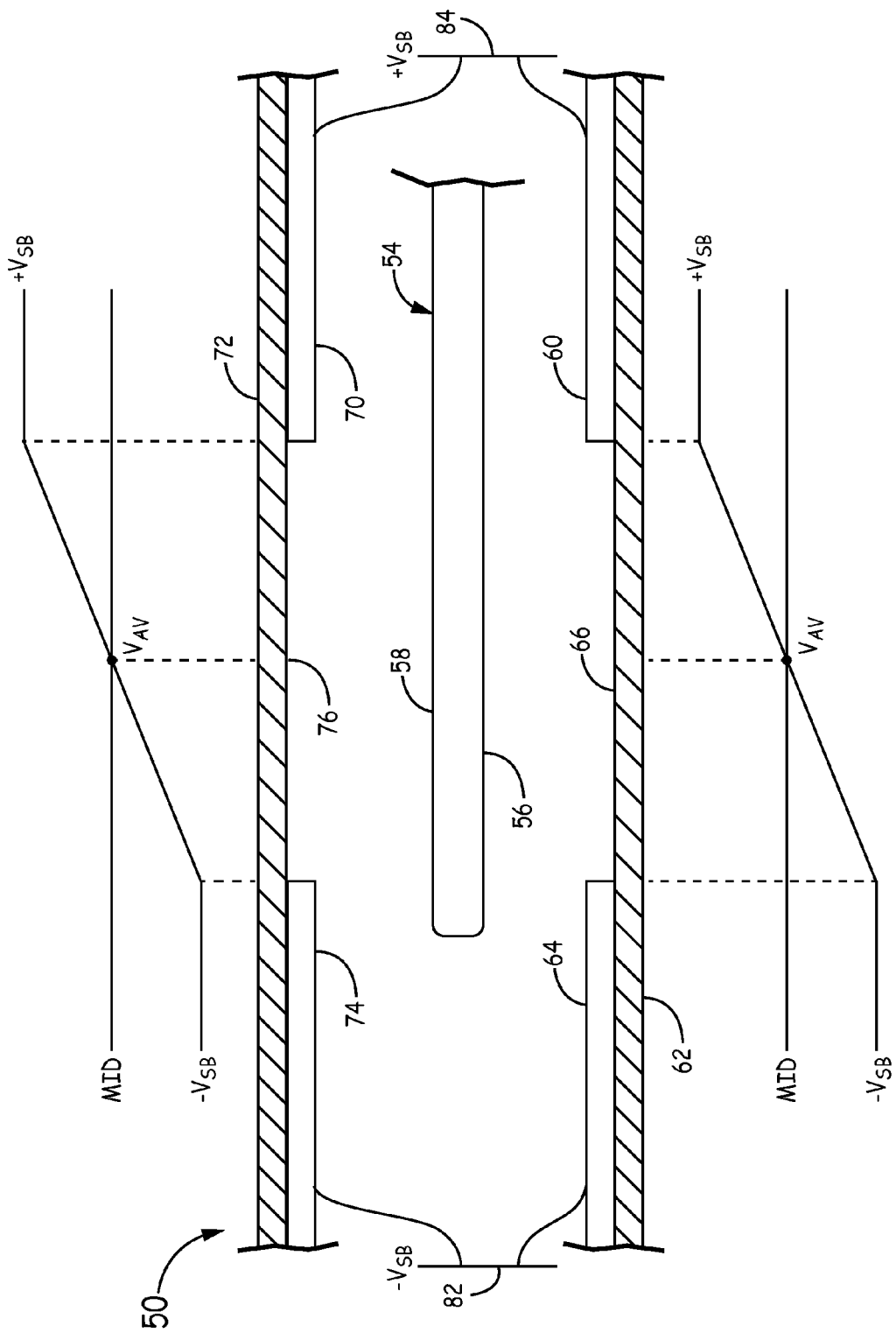
FIG. 1B is a schematic depiction of a MEMS device and voltage diagrams, which illustrate the present technique according to another embodiment.

FIG. 1B is a schematic depiction of a MEMS device 50 according to another embodiment, which illustrates another aspect of the present technique. The MEMS device 50 generally includes a proof mass 54 positioned between a first sense plate 60 and a second sense plate 70. The first sense plate 60 is attached to a first glass layer 62, and a first outboard metallization layer 64 is attached to glass layer 62. The glass layer 62 is doped with conductive molecules to aid in the attachment of sense plate 60 and metallization layer 64. An exposed glass portion 66 of glass layer 62 faces a first edge surface 56 of proof mass 54. The second sense plate 70 is attached to a second glass layer 72, and a second outboard metallization layer 74 is attached to glass layer 72. The glass layer 72 is also doped with conductive molecules to aid in the attachment of sense plate 70 and metallization layer 74. An exposed glass portion 76 of glass layer 72 faces a second edge surface 58 of proof mass 54. When power is applied to MEMS device 50, the exposed glass portions 66 and 76 slowly collect a charge over time.

As shown in FIG. 1B, metallization layers 64 and 74 are connected to a $-V_{SB}$ line 82, and sense plates 60 and 70 are connected to a $+V_{SB}$ line 84. Alternatively, metallization layers 64 and 74 can be connected to $+V_{SB}$ line 84, and sense plates 60 and 70 can be connected to $-V_{SB}$ line 82. This symmetrical $V_{AV}$ configuration results in the exposed glass portions 66 and 76 having the same average voltage (MID), as illustrated in the voltage diagrams. As the exposed glass portions 66 and 76 on each side of proof mass 54 achieve the same average potential over time, the effect of time-varying glass charging on the sensor capacitance is eliminated, while allowing the proof mass to have a different voltage than the exposed glass portions if desired.

Figure 2:
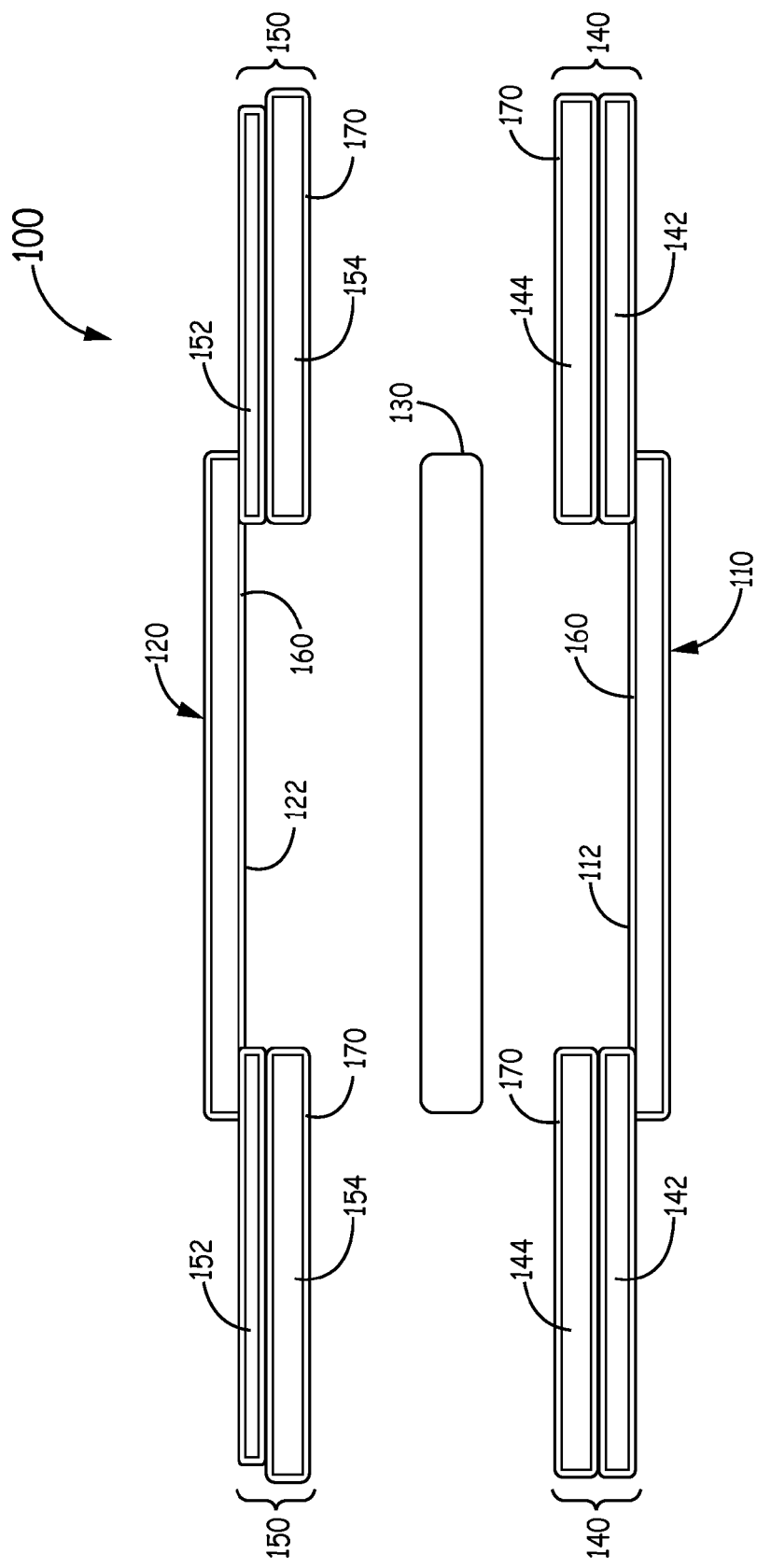
FIG. 2 is an end view of a MEMS device according to another embodiment.
Figure 3:
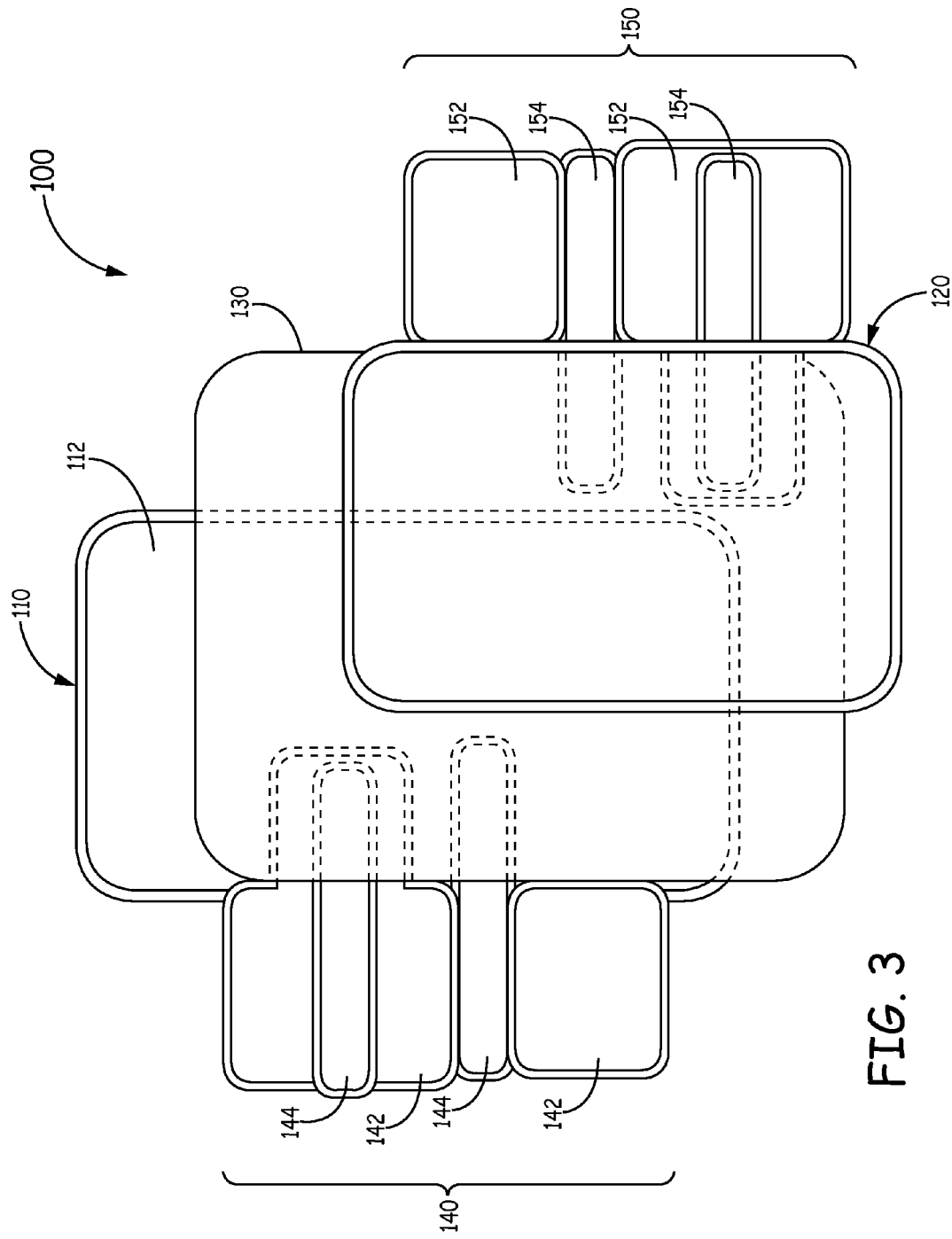
FIG. 3 is a top view of a MEMS device according to another embodiment.

FIGS. 2 and 3 are schematic depictions of a capacitive MEMS device 100 according to one embodiment, in which the present technique can be implemented. The capacitive MEMS device 100 generally includes a first sense plate 110 with an inner surface 112, a second sense plate 120 with an inner surface 122, and a proof mass 130 positioned between first and second sense plates 110, 120 such that proof mass 130 faces each of inner surfaces 112 and 122. For ease of illustration, sense plates 110, 120 and proof mass 130 are shown offset from each other in FIG. 3, but in actual design are aligned vertically as shown in FIG. 2.

A first set of stop structures 140 is attached to inner surface 112 of first sense plate 110. The stop structures 140 include metalized glass portions 142 coupled to inner surface 112, and standoff portions 144 that are separated from sense plate 110 by metalized glass portions 142. Likewise, a second set of stop structures 150 is attached to inner surface 122 of second sense plate 120. The stop structures 150 include metalized glass portions 152 coupled to inner surface 122, and standoff portions 154 that are separated from sense plate 120 by metalized glass portions 152. Although a single stop structure is shown on each of sense plates 110 and 120 in FIG. 3 for clarity, it should be understood that two or more stop structures are typically located on opposite sides of each sense plate, as shown in FIG. 2.

The sense plates 110, 120 have exposed glass layers 160 thereon, and stop structures 140, 150 have glass layer 170 thereon. As the exposed glass layers can change potential at different locations on the stop structures, the present approach provides for the stop structures to be voltage-balanced (i.e., stop structure 150 potential matches that of proof mass 130) to mitigate the consequences of the stop structures having a different voltage than the proof mass.

For example, during operation of MEMS device 100, sense plate 110 has a first voltage (e.g., −V1), proof mass 130 has a second voltage (e.g., +V2) that is higher than the first voltage, and sense plate 120 has a third voltage (e.g., V3) that is higher than the second voltage. The standoff portions 144, 154 are configured to have a voltage that matches the voltage of proof mass 130, such that it is not electrically disruptive to MEMS device 100 if standoff portions 144, 154 touch proof mass 130 during operation.

Exposed glass portions facing proof mass 130 occur at the boundaries between metalized glass portions 142 and standoff portions 144, and at the boundaries between metalized glass portions 152 and standoff portions 154. A plurality of voltage sources can be coupled to MEMS device 100 such that the exposed glass portions have an average voltage that is electrically neutral with respect to the voltage of proof mass 130 during operation of MEMS device 100. In one embodiment, a first applied voltage is a positive voltage and a second applied voltage is a negative voltage, with the positive and negative voltages having substantially the same numerical value such that the exposed glass has an average voltage that is substantially at ground.

Figure 4:
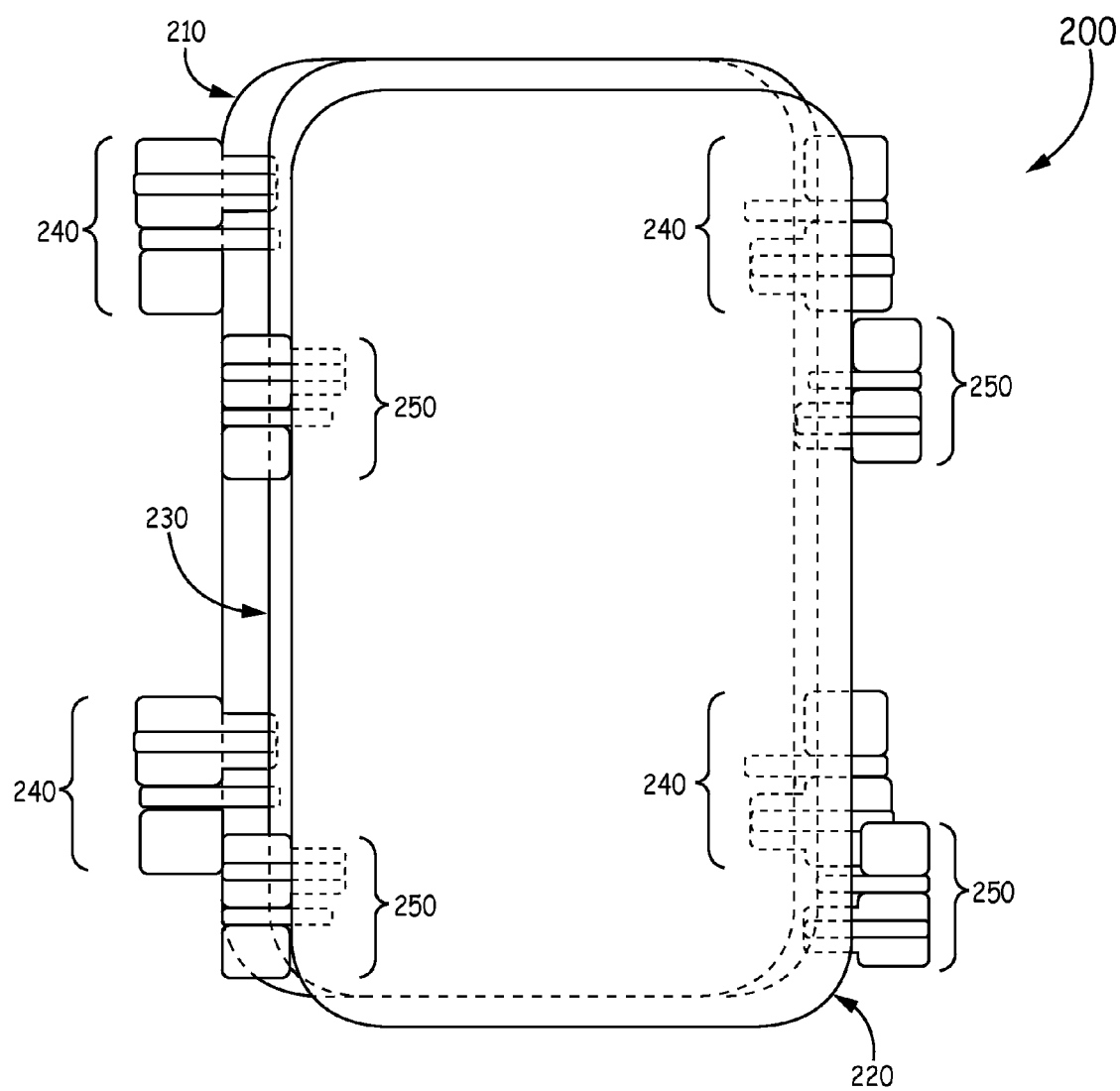
FIG. 4 is a top view of a MEMS device according to another embodiment.
Figure 5A:
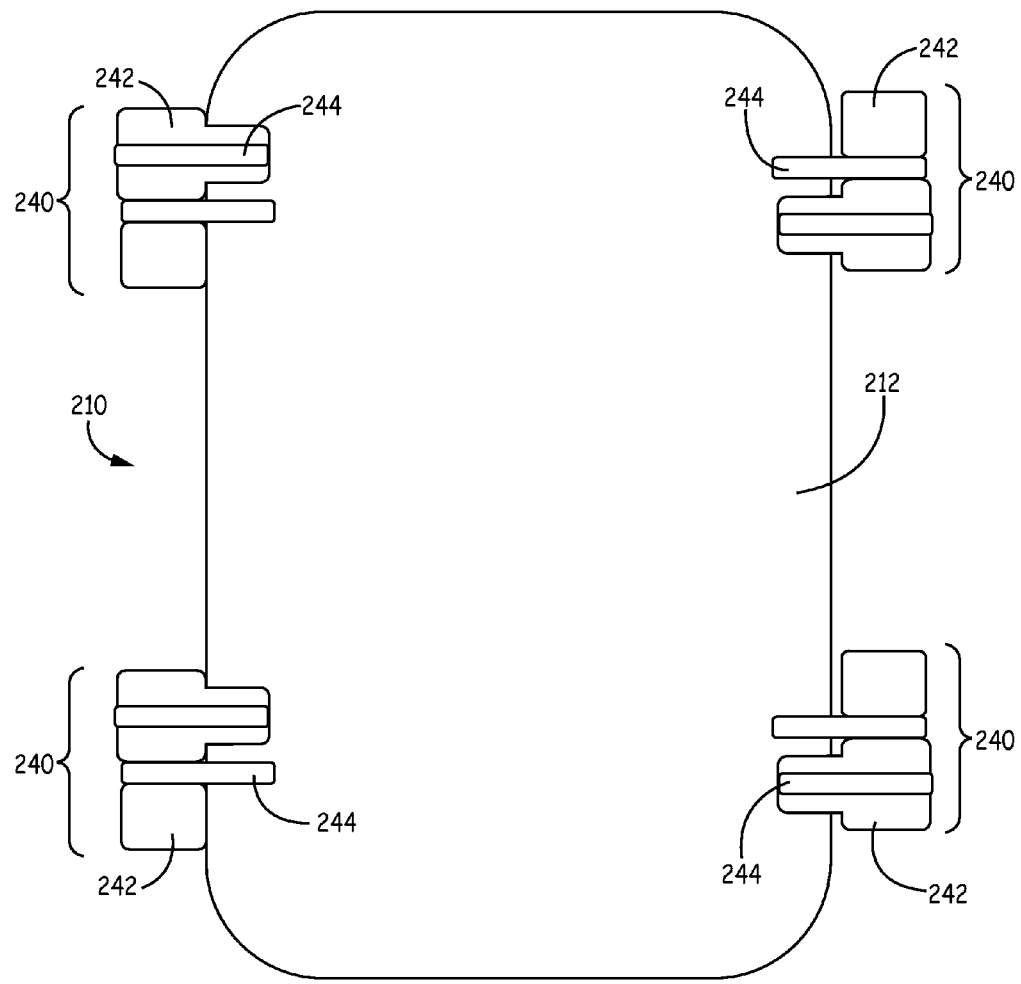
FIG. 5A illustrates a first sense plate of the MEMS device of FIG. 4.
Figure 5B:
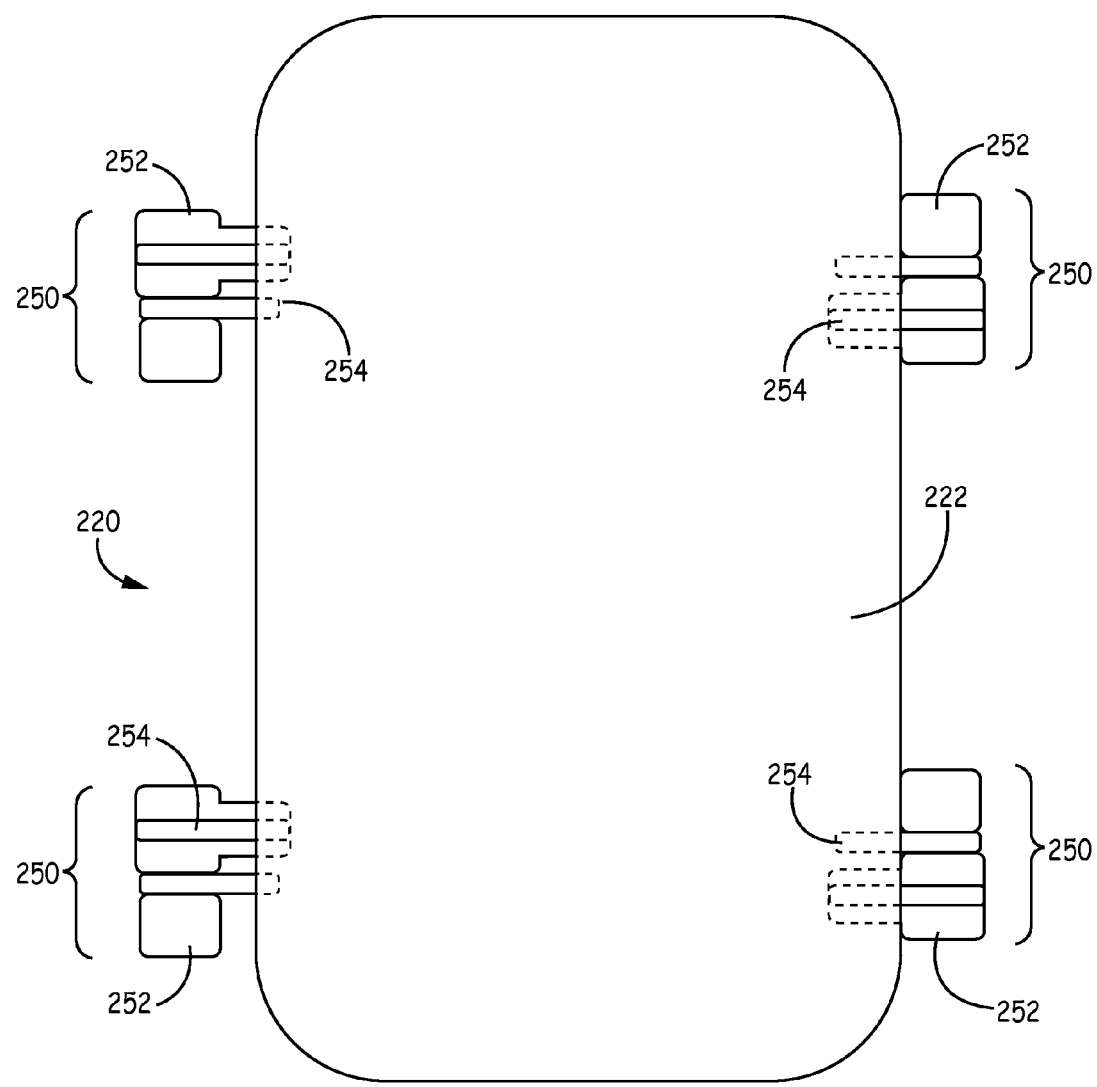
FIG. 5B illustrates a second sense plate of the MEMS device of FIG. 4.

FIGS. 4 and 5A-5B are schematic top-down depictions of a MEMS device 200 according to another embodiment. The MEMS device 200 includes a first sense plate 210, a second sense plate 220, and a proof mass 230 positioned between first and second sense plates 210, 220. While sense plates 210, 220 and proof mass 230 are shown offset from each other in FIG. 4 for ease of illustration, these structures are in actual design aligned vertically, such as depicted for MEMS device 100 in FIG. 2. FIG. 5A shows first sense plate 210 separated from the other structures of MEMS device 200, and FIG. 5B depicts second sense plate 220 separated from the other structures of MEMS device 200.

As illustrated in FIGS. 4 and 5A, a first set of stop structures 240 are attached to an inner surface 212 of first sense plate 210 such that stop structures 240 face proof mass 230. The stop structures 240 each include metalized glass portions 242 and standoff portions 244. Likewise, as shown in FIGS. 4 and 5B, a second set of stop structures 250 are attached to an inner surface 222 of second sense plate 220 such that stop structures 250 face proof mass 230. The stop structures 250 each include metalized glass portions 252 and standoff portions 254. The standoff portions 244 prevent first sense plate 210 from contacting proof mass 230 during operation of MEMS device 200. Likewise, standoff portions 254 prevent second sense plate 220 from contacting proof mass 230 during operation of MEMS device 200.

While FIG. 4 shows four stop structures around the perimeter of each of sense plates 210 and 220, it should be understood that one or more additional stop structures can be utilized as needed, such as in high G-force applications.

Exposed glass portions facing proof mass 230 occur at the interfaces between metalized glass portions 242 and standoff portions 244, and at the interfaces between metalized glass portions 252 and standoff portions 254. A plurality of voltage sources can be coupled to MEMS device 200 such that the exposed glass portions have an average voltage that is electrically neutral with respect to a voltage level of the proof mass during operation of MEMS device 200.

Example Embodiments

Example 1 includes a method of controlling exposed glass charging in a micro-electro-mechanical systems (MEMS)

device, the method comprising: providing a MEMS device comprising a proof mass positioned apart from at least one sense plate and at least one outboard metallization layer, wherein at least one conductive glass layer is coupled to the sense plate and the outboard metallization layer, the conductive glass layer including at least one exposed glass portion near the proof mass; and applying a first voltage to the sense plate and a second voltage to the outboard metallization layer, the first voltage separated from the second voltage by a predetermined voltage level such that the exposed glass portion has an average voltage corresponding to a voltage midway between the first voltage and the second voltage.

Example 2 includes the method of Example 1, wherein the first voltage is separated from the second voltage such that the exposed glass portion has an average voltage that is substantially at the same potential as that of the proof mass.

Example 3 includes the method of Example 1, wherein the proof mass is positioned between a first sense plate and a second sense plate, the first sense plate attached to a first conductive glass layer and a first outboard metallization layer attached to the first conductive glass layer, the second sense plate attached to a second conductive glass layer and a second outboard metallization layer attached to the second conductive glass layer.

Example 4 includes the method of Example 3, wherein an exposed glass portion of the first glass layer faces a first edge surface of the proof mass, and an exposed glass portion of the second glass layer faces a second edge surface of the proof mass.

Example 5 includes the method of any of Examples 3-4, wherein the first voltage is applied to the first and second sense plates and the second voltage is applied to the first and second outboard metallization layers, the first voltage separated from the second voltage such that the exposed glass portions each have an average voltage corresponding to a voltage midway between the first voltage and the second voltage.

Example 6 includes the method of any of Examples 3-5, wherein the exposed glass portions have substantially the same average voltages as that of the proof mass.

Example 7 includes the method of any of Examples 1-6, wherein the first voltage is a positive voltage and the second voltage is a negative voltage.

Example 8 includes the method of any of Examples 1-7, and further comprising a plurality of stop structures coupled to the sense plate.

Example 9 includes the method of any of Examples 1-8, wherein the MEMS device comprises a gyroscope or an accelerometer.

Example 10 includes a micro-electro-mechanical systems (MEMS) device, comprising: a proof mass; a first sense plate positioned apart from the proof mass; a first outboard metallization layer positioned apart from the proof mass; a first conductive glass layer coupled to the first sense plate and the first outboard metallization layer, the first conductive glass layer including at least one exposed glass portion near the proof mass; a first voltage line electrically connected to the first sense plate and having a first voltage level; and a second voltage line electrically connected to the first outboard metallization layer and having a second voltage level that is different than the first voltage level; wherein the exposed glass portion has an average voltage corresponding to a voltage midway between the first voltage level and the second voltage level.

Example 11 includes the MEMS device of Example 10, wherein the first voltage level is separated from the second voltage level such that the exposed glass portion has an average voltage that is substantially at the same potential as that of the proof mass.

Example 12 includes the MEMS device of Examples 10-11, and further comprising: a second sense plate positioned apart from the proof mass opposite from the first sense plate such that the proof mass is between the first sense plate and the second sense plate; a second outboard metallization layer positioned apart from the proof mass; and a second conductive glass layer coupled to the second sense plate and the second outboard metallization layer, the second conductive glass layer including at least one exposed glass portion near the proof mass.

Example 13 includes the MEMS device of any of Examples 10-12, wherein the exposed glass portion of the first glass layer faces a first edge surface of the proof mass, and the exposed glass portion of the second glass layer faces a second edge surface of the proof mass.

Example 14 includes the MEMS device of any of Examples 10-13, wherein the first voltage line is electrically connected to the second sense plate, and the second voltage line is electrically connected to the second outboard metallization layer.

Example 15 includes the MEMS device of any of Examples 10-14, wherein the first voltage level is separated from the second voltage level such that the exposed glass portions each have an average voltage corresponding to a voltage midway between the first voltage level and the second voltage level.

Example 16 includes the MEMS device of any of Examples 10-15, and further comprising a plurality of stop structures coupled to the first and second sense plates.

Example 17 includes the MEMS device of any of Examples 10-16, wherein the MEMS device comprises a gyroscope or an accelerometer.

Example 18 includes a MEMS device comprising: a first sense plate with a first inner surface; a second sense plate with a second inner surface; a proof mass located between the first and second sense plates such that the proof mass faces each of the first and second inner surfaces; a first set of stop structures coupled to the first inner surface of the first sense plate; a second set of stop structures coupled to the second inner surface of the second sense plate; a first conductive glass layer coupled to the first sense plate and the first set of stop structures, the first conductive glass layer including at least one exposed glass portion near the proof mass; and a second conductive glass layer coupled to the second sense plate and the second set of stop structures, the second conductive glass layer including at least one exposed glass portion near the proof mass; wherein a plurality of voltage sources are coupled to the MEMS device such that the exposed glass portions have an average voltage that is electrically neutral with respect to a voltage level of the proof mass during operation of the MEMS device.

Example 19 includes the MEMS device of Example 18, wherein each of the stop structures include one or more metalized glass portions, and one or more standoff portions that are separated from the sense plates by the metalized glass portions.

Example 20 includes the MEMS device of any of Examples 18-19, wherein the standoff portions are configured to have a voltage level that matches the voltage level of the proof mass.

The present invention may be embodied in other forms without departing from its essential characteristics. The described embodiments are to be considered in all respects only as illustrative and not restrictive. Therefore, it is intended that this invention be limited only by the claims and the equivalents thereof.

What is claimed is:

1. A method of controlling exposed glass charging in a micro-electro-mechanical systems (MEMS) device, the method comprising:
   providing a MEMS device comprising a proof mass positioned apart from at least one sense plate and at least one outboard metallization layer, wherein at least one conductive glass layer is coupled to the at least one sense plate and the at least one outboard metallization layer, the at least one conductive glass layer including at least one exposed glass portion near the proof mass;
   applying an electrical potential to the proof mass; and
   applying a first voltage to the at least one sense plate and a second voltage to the at least one outboard metallization layer, the first voltage separated from the second voltage by a predetermined voltage level such that the at least one exposed glass portion has an average voltage corresponding to a voltage midway between the first voltage and the second voltage, wherein the average voltage of the at least one exposed glass portion is at the same potential as that of the proof mass;
   wherein the first voltage is non-symmetrically separated from the second voltage, and the electrical potential applied to the proof mass is non-zero.

2. The method of claim 1, wherein the proof mass is positioned between a first sense plate and a second sense plate, the first sense plate attached to a first conductive glass layer and a first outboard metallization layer attached to the first conductive glass layer, the second sense plate attached to a second conductive glass layer and a second outboard metallization layer attached to the second conductive glass layer.

3. The method of claim 2, wherein a first exposed glass portion of the first glass layer faces a first edge surface of the proof mass, and a second exposed glass portion of the second glass layer faces a second edge surface of the proof mass.

4. The method of claim 3, wherein the first voltage is applied to the first and second sense plates and the second voltage is applied to the first and second outboard metallization layers, the first voltage separated from the second voltage such that the first and second exposed glass portions each have an average voltage corresponding to a voltage midway between the first voltage and the second voltage.

5. The method of claim 4, wherein the first and second exposed glass portions have substantially the same average voltages as that of the proof mass.

6. The method of claim 1, wherein the first voltage is a positive voltage and the second voltage is a negative voltage.

7. The method of claim 1, further comprising a plurality of stop structures coupled to the at least one sense plate.

8. The method of claim 1, wherein the MEMS device comprises a gyroscope or an accelerometer.

9. A micro-electro-mechanical systems (MEMS) device, comprising:
   a proof mass with an electrical potential applied thereto;
   a first sense plate positioned apart from the proof mass;
   a first outboard metallization layer positioned apart from the proof mass;
   a first conductive glass layer coupled to the first sense plate and the first outboard metallization layer, the first conductive glass layer including at least one first exposed glass portion near the proof mass;
   a first voltage line electrically connected to the first sense plate and having a first voltage level; and
   a second voltage line electrically connected to the first outboard metallization layer and having a second voltage level that is different than the first voltage level;
   wherein the first voltage level is separated from the second voltage level such that the first exposed glass portion has an average voltage corresponding to a voltage midway between the first voltage level and the second voltage level, the average voltage of the first exposed glass portion equal to that of the proof mass;
   wherein the first voltage level is non-symmetrically separated from the second voltage level, and the electrical potential applied to the proof mass is non-zero.

10. The MEMS device of claim 9, further comprising:
   a second sense plate positioned apart from the proof mass opposite from the first sense plate such that the proof mass is between the first sense plate and the second sense plate;
   a second outboard metallization layer positioned apart from the proof mass; and
   a second conductive glass layer coupled to the second sense plate and the second outboard metallization layer, the second conductive glass layer including at least one second exposed glass portion near the proof mass.

11. The MEMS device of claim 10, wherein the at least one first exposed glass portion of the first glass layer faces a first edge surface of the proof mass, and the at least one second exposed glass portion of the second glass layer faces a second edge surface of the proof mass.

12. The MEMS device of claim 11, wherein the first voltage line is electrically connected to the second sense plate, and the second voltage line is electrically connected to the second outboard metallization layer.

13. The MEMS device of claim 12, wherein the first voltage level is separated from the second voltage level such that the at least one first exposed glass portion and the at least one second exposed glass portion each have an average voltage corresponding to a voltage midway between the first voltage level and the second voltage level.

14. The MEMS device of claim 12, further comprising a plurality of first stop structures coupled to the first sense plate and a plurality of second stop structures coupled to the second sense plate.

15. The MEMS device of claim 9, wherein the MEMS device comprises a gyroscope or an accelerometer.

* * * * *